United States Patent
Agarwal et al.

(10) Patent No.: US 12,237,442 B2
(45) Date of Patent: Feb. 25, 2025

(54) PHOTONIC PACKAGE LASER AREA MACRO-VOID PRESSURE RELIEF MICRO-CHANNELS

(71) Applicant: Intel Corporation, Santa Clara, CA (US)

(72) Inventors: Ankur Agarwal, Chandler, AZ (US); Priyanka Dobriyal, Milpitas, CA (US)

(73) Assignee: Intel Corporation, Santa Clara, CA (US)

(*) Notice: Subject to any disclaimer, the term of this patent is extended or adjusted under 35 U.S.C. 154(b) by 722 days.

(21) Appl. No.: 17/100,595

(22) Filed: Nov. 20, 2020

(65) Prior Publication Data

US 2021/0408339 A1    Dec. 30, 2021

Related U.S. Application Data

(60) Provisional application No. 63/043,325, filed on Jun. 24, 2020.

(51) Int. Cl.
| | |
|---|---|
| *H01L 21/56* | (2006.01) |
| *H01L 23/31* | (2006.01) |
| *H01L 33/26* | (2010.01) |
| *H01L 33/40* | (2010.01) |
| *H01L 33/48* | (2010.01) |

(52) U.S. Cl.
CPC .......... *H01L 33/483* (2013.01); *H01L 21/563* (2013.01); *H01L 23/31* (2013.01); *H01L 33/26* (2013.01); *H01L 33/40* (2013.01)

(58) Field of Classification Search
CPC .................................................... H01L 21/563
See application file for complete search history.

(56) References Cited

U.S. PATENT DOCUMENTS

| | | | | |
|---|---|---|---|---|
| 6,288,451 | B1* | 9/2001 | Tsao | H01L 23/13 |
| | | | | 361/720 |
| 7,381,590 | B2* | 6/2008 | Choudhary | H01L 21/563 |
| | | | | 438/118 |
| 7,605,477 | B2* | 10/2009 | Wong | H01L 25/0657 |
| | | | | 257/E23.021 |
| 8,357,565 | B2* | 1/2013 | Ofner | H01L 21/563 |
| | | | | 257/E21.503 |
| 9,559,030 | B2* | 1/2017 | Gocho | H01L 24/17 |
| 9,627,346 | B2* | 4/2017 | Hsu | H01L 23/3128 |
| 10,811,279 | B2* | 10/2020 | Pelletier | H01L 24/17 |
| 2006/0057774 | A1* | 3/2006 | Hiatt | H01L 24/29 |
| | | | | 257/E23.098 |
| 2019/0067037 | A1* | 2/2019 | Pelletier | H01L 24/17 |

FOREIGN PATENT DOCUMENTS

KR        20170074487        *    6/2017

* cited by examiner

*Primary Examiner* — David A Zarneke
(74) *Attorney, Agent, or Firm* — Schwabe, Williamson & Wyatt P.C.

(57) ABSTRACT

Embodiments disclosed herein include electronic packages with vents to prevent pressure buildup below a die. In an embodiment, an electronic package comprises a package substrate and a die attached to the package substrate by interconnects. In an embodiment, an underfill is under the die and surrounds the interconnects. In an embodiment, a void is provided in the underfill, and a vent is in the underfill. In an embodiment, the vent is fluidically coupled to the void and extends to an edge of the underfill.

20 Claims, 12 Drawing Sheets

PHOTONIC PACKAGE LASER AREA MACRO-VOID PRESSURE RELIEF MICRO-CHANNELS

CROSS-REFERENCE TO RELATED APPLICATION

This patent application is a conversion of U.S. Provisional Patent Application No. 63/043,325, filed Jun. 24, 2020, the entire disclosure of which is hereby incorporated by reference in its entirety and for all purposes.

TECHNICAL FIELD

Embodiments of the present disclosure relate to semiconductor devices, and more particularly to photonic integrated circuits (PICs) with macro underfill voids and pressure relief channels.

BACKGROUND

Current PIC designs have been able to incorporate lasers at the die edge or in very small regions within the interior of the die. Such PICs were assembled using chip-on-chip assembly where underfill dispense could be avoided over the lasers. However, in advanced PIC systems, larger areas of the die interior are reserved for the lasers. Additionally, in advanced PIC systems, co-packaging the PIC with the switch demands PIC flip-chip packaging to an organic substrate.

Flip-chip packaging requires the use of an underfill. However, the underfill dispense needs to be avoided over the lasers for reliability reasons. Accordingly, large voids (i.e., macro voids) in the underfill are necessary. These large voids may function as pressure chambers for moisture degassing from substrates and solvent degassing during epoxy cure. This pressure build up can lead to damage on the neighboring joints, silicon, or substrate during subsequent thermal exposure steps like surface mount during module assembly.

EMBODIMENTS OF THE PRESENT DISCLOSURE

Described herein are electronic packages with photonics ICs (PICs) that include macro voids in the underfill and pressure relief vents, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, advances in photonic IC (PIC) bandwidth has led to packaging architectures with the PIC being flip-chip bonded to an organic substrate (e.g., a package substrate). Additionally, the lasers of the PIC may be moved into a central region of the die. As such, macro voids in the underfill are needed in order to prevent damage or decreased functionality of the lasers. By removing interconnect bumps and underfill from below the lasers, there is a reduction in the stress that may otherwise damage the lasers.

Figure 1:
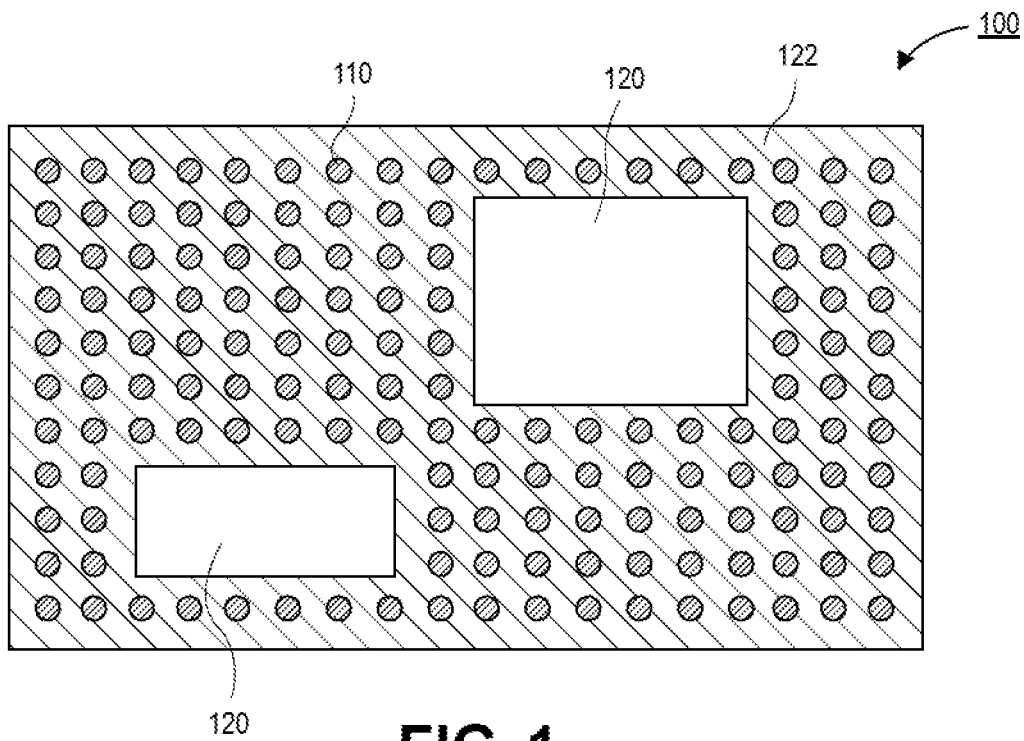
FIG. 1 is a plan view illustration of an electronic package for a photonic IC (PIC) with interior macro voids in the underfill, in accordance with an embodiment.

An example of an electronic package 100 with macro voids 120 is shown in FIG. 1. FIG. 1 is a plan view illustration of the bump map below a PIC (not shown). A regular pattern of bumps 110 may be distributed below the PIC, with the exception of macro void 120 regions. That is, the macro void 120 regions are free from bumps 110. Additionally, an underfill 122 is provided around the bumps 110. The underfill 122 may also be absent from the macro void 120 regions. The macro voids 120 may be positioned below the lasers of the PIC.

While macro voids 120 are needed for the proper functioning of the lasers, macro voids 120 are problematic in the electronic package 100 and may provide reliability concerns. Particularly, the macro voids 120 become pressure chambers for moisture degassing from substrates and solvent degassing during epoxy cure. This pressure build up can lead to damage on the neighboring joints, silicon, or substrate during subsequent thermal exposure steps like surface mount during module assembly.

Accordingly, embodiments disclosed herein include micro vents that connect the macro voids 120 to the edge of the underfill. The micro vents allow for outgassed moisture to vent to the die edge instead of being trapped in the macro voids 120. As such, the presence of the macro voids in the underfill does not provide reliability risks.

Figure 2A:
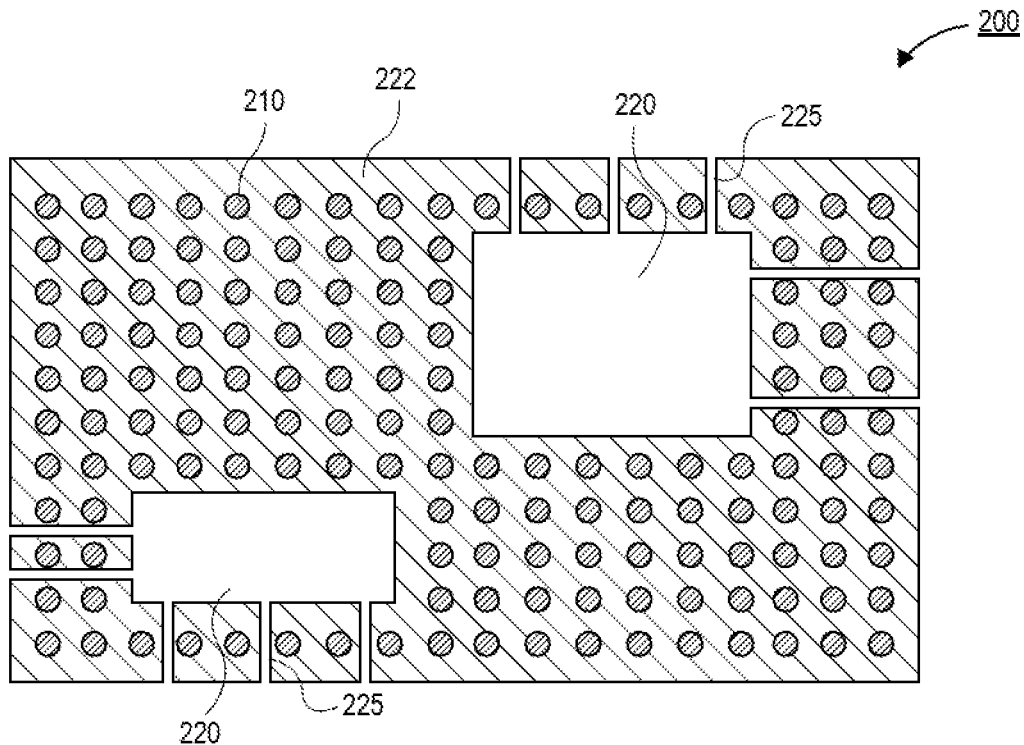
FIG. 2A is a plan view illustration of an electronic package for a PIC with interior macro voids in the underfill and vents from the macro voids to the edge of the underfill, in accordance with an embodiment.

Referring now to FIG. 2A, a plan view illustration of a portion of an electronic package 200 is shown, in accordance with an embodiment. The portion of the electronic package 200 shown in FIG. 2A is the portion below a PIC. The PIC is not shown in order to not obscure embodiments disclosed herein. Similar to FIG. 1, the electronic package 200 comprises an underfill 222 that surrounds bumps 210. One or more macro voids 220 may be provided in the underfill 222. The macro voids 220 may be positioned below regions where lasers are provided in the PIC. In an embodiment, the bumps 210 and the underfill 222 may be located above a package substrate. The package substrate may be an organic package substrate in some embodiments. In the illustrated embodiment, two macro voids 220 are shown, but it is to be appreciated that any number of macro voids 220 may be provided in the electronic package 200.

In an embodiment, vents 225 may intersect the macro voids 220. The vents 225 may extend from the macro voids 220 to the edge of the underfill 222. For example, the vents 225 may extend past an edge of the overlying die (e.g., the PIC die) in some embodiments. The vents 225 may be positioned between bumps 210. In the illustrated embodiment, the vents 225 are shown as straight lines. However, the vents 225 may include bends or turns in order to be routed between the bumps 210 in some embodiments.

In an embodiment, the vents 225 may be referred to as micro vents due to the dimensions of the vents 225 being on the micron scale. For example, the vents 225 may have a height that is approximately 20 µm or less. This allows the vents 225 to not get damaged during post chip attach. For example, the distance between the die and the package substrate is typically 50 µm to 60 µm. In an embodiment, the vents 225 may have a width that is approximately 20 µm or less.

In the illustrated embodiment, a plurality of vents 225 are provided for each of the macro voids 220. However, it is to be appreciated that a macro void 220 may comprise a single vent 225. Additionally, vents 225 are illustrated extending out from two edges of each of the macro voids 220. However, it is to be appreciated that vents 225 may intersect one or more edges of each macro void 220.

Figure 2B:
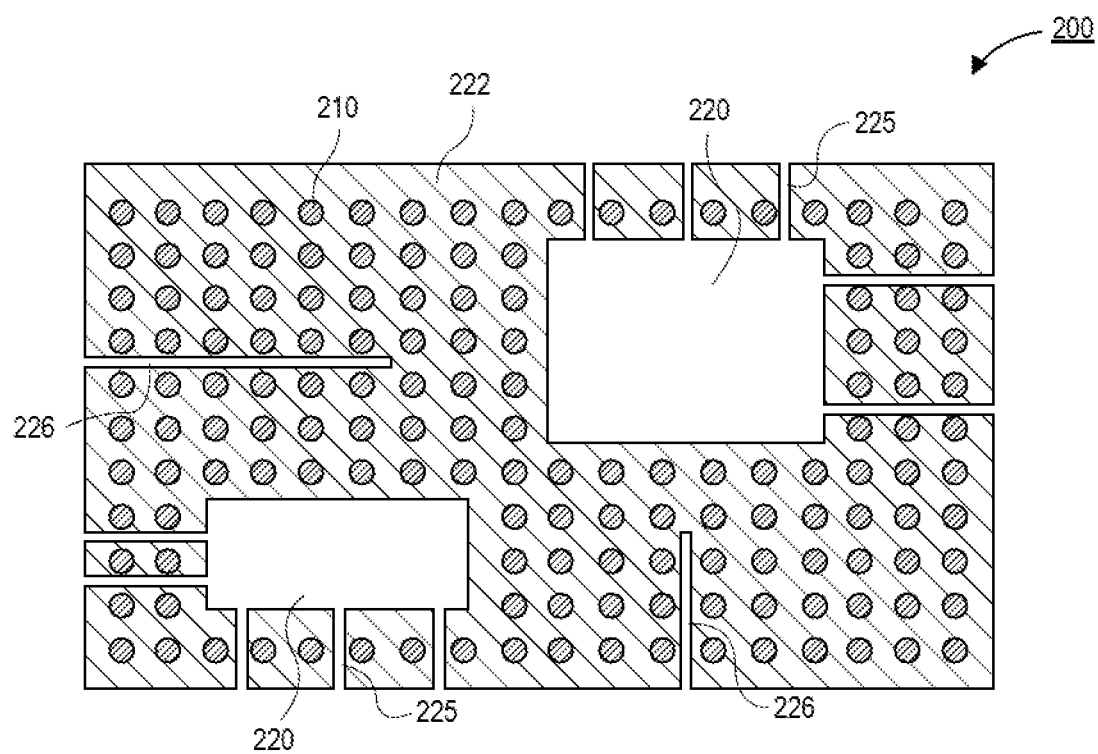
FIG. 2B is a plan view illustration of an electronic package for a PIC with interior macro voids in the underfill and vents from the macro voids to the edge of the underfill and vents to interior portions of the electronic package, in accordance with an embodiment.

Referring now to FIG. 2B, a plan view illustration of a portion of an electronic package 200 is shown, in accordance with an additional embodiment. The electronic package 200 in FIG. 2B may be substantially similar to the electronic package 200 in FIG. 2A, with the exception of there being additional vents 226. The vents 226 may extend to an edge of the underfill 222. However, unlike vents 225, the vents 226 do not intersect the macro voids 220. The vents 226 may provide exit paths for outgassed substances that do not reach the macro voids.

Figure 2C:
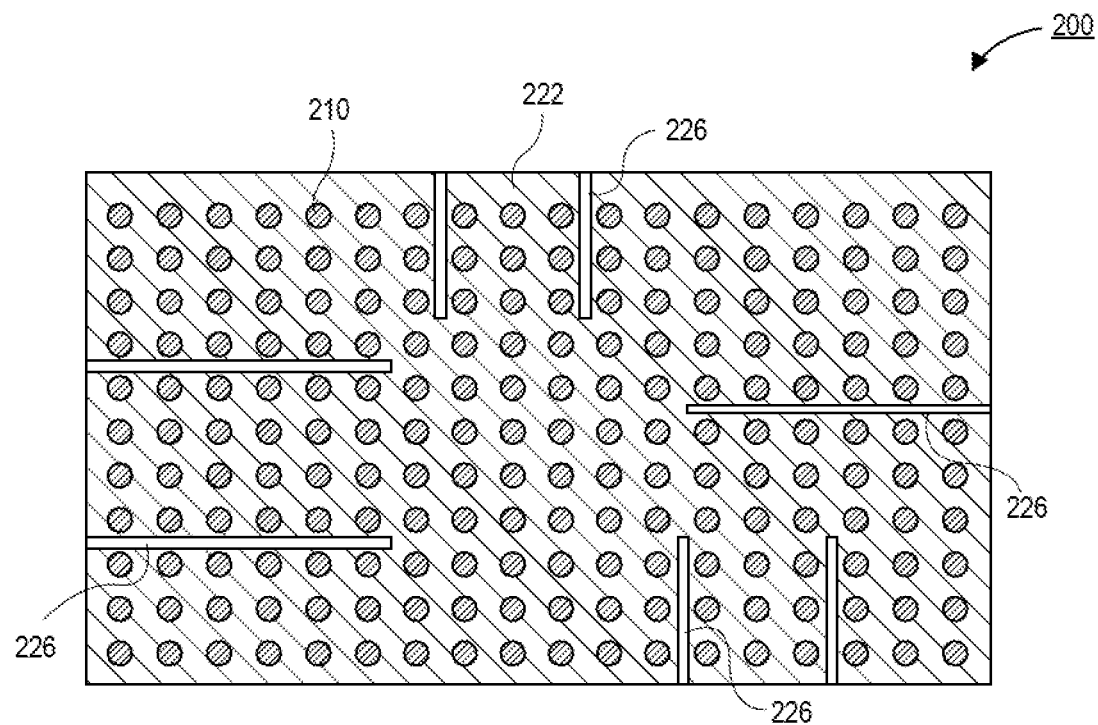
FIG. 2C is a plan view illustration of an electronic package with vents to interior portions of the electronic package, in accordance with an embodiment.

In the illustrated embodiment, vents 225 and vents 226 are both present in the electronic package. However, it is to be appreciated that in some embodiments, only vents 226 may be present. For example, FIG. 2C is an example of an electronic package 200 where there are no macro voids 220. Despite there being no macro voids 220, there are vents 226 that provide exits for outgassed substances. That is, outgassed substances may propagate to the vents 226 and flow along the vents 226 to the edge of the underfill 222. Such embodiments, are therefore applicable to other types of packages than photonics packages. Particularly, any flip-chip architecture (e.g., ball grid array (BGA)) may benefit from having vents 226 to release substrate moisture degassing from under the die. Stress sensitive architectures (e.g., micro-electromechanical system (MEMS) architectures) may also benefit from the use of vents 226.

Figure 3A:
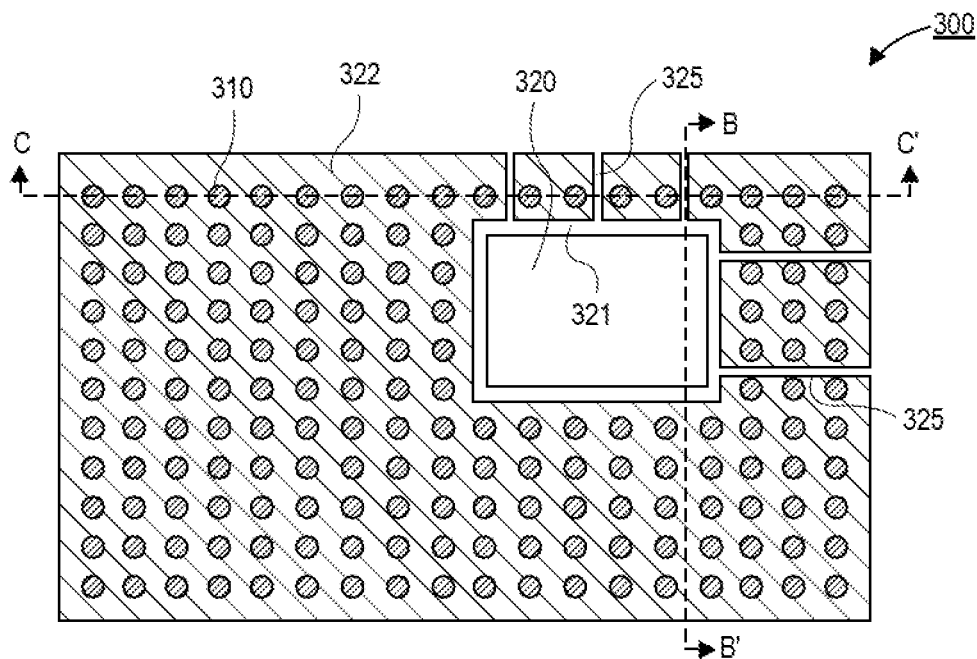
FIG. 3A is a plan view illustration of an electronic package for a PIC with an interior macro void in the underfill that is surrounded by a trench, and vents in the underfill from the macro voids to the edge of the underfill, in accordance with an embodiment.

Referring now to FIG. 3A a plan view illustration of an electronic package 300 is shown, in accordance with an embodiment. In an embodiment, the PIC is omitted in order to not obscure the underlying feature. As shown, the electronic package 300 comprises a plurality of bumps 310 that are surrounded by an underfill 322. The bumps 310 and the underfill 322 may be absent from a macro void 320 region. As shown in FIG. 3A, the macro void 320 may be surrounded by a trench 321. The trench 321 may extend into the package substrate. For example, the trench 321 may be formed into a solder resist layer of the package substrate. The trench 321 provides a physical barrier that prevents the underfill 322 from flowing into the macro void 320 region. In the illustrated embodiment, the trench 321 is completely free from underfill 322. However, it is to be appreciated that some excess underfill 322 may flow into the trench 321 in some embodiments.

In an embodiment, a plurality of vents 325 may intersect the macro void 320. Particularly, the plurality of vents 325 may extend from an edge of the underfill 322 to the trench 321. Since the trench 321 is not completely filled by the underfill, the vent 325 is fluidically coupled to the macro void 320 on the other side of the trench 321. As such, pressure that may otherwise build up in the macro void 320 is able to be vented to the edge of the underfill 322.

Figure 3B:
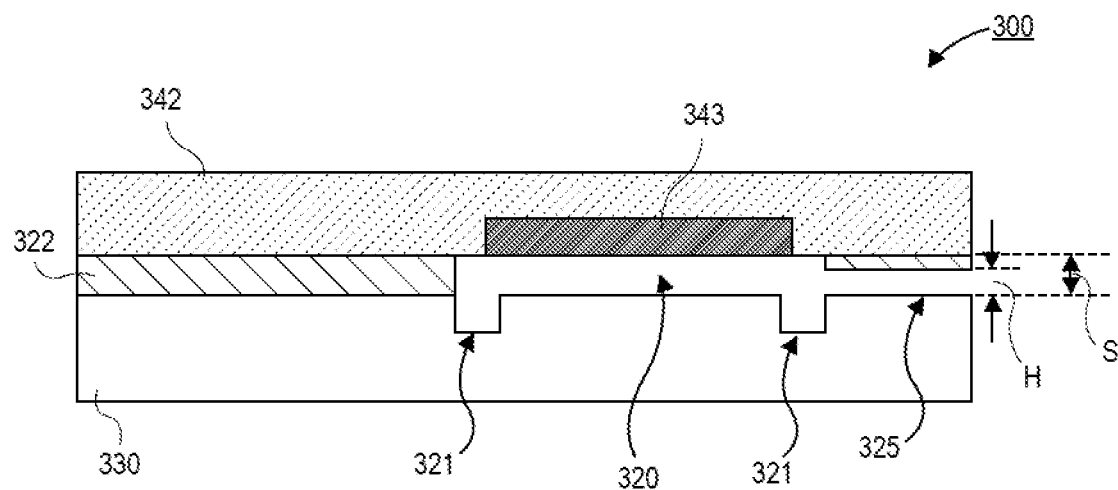
FIG. 3B is a cross-sectional illustration of the electronic package in FIG. 3A along line B-B', in accordance with an embodiment.

Referring now to FIG. 3B, a cross-sectional illustration of the electronic package 300 in FIG. 3A along line B-B' is shown, in accordance with an embodiment. As shown, a die 342 is provided over a package substrate 330. In a particular embodiment, the die 342 is a PIC or other stress sensitive die, such as a die with a MEMS device. In an embodiment, the package substrate 330 comprises organic layers. The underfill 322 is provided between the die 342 and the package substrate 330. The cross-sectional view in FIG. 3B does not pass through any bumps 310, but it is to be appreciated that bumps 310 are also provided between the die 342 and the package substrate 330.

As shown, a macro void 320 is provided in the underfill 322. The macro void 320 is a region that is free from bumps 310 and underfill 322 between a top surface of the package substrate and a bottom surface of the die 342. In an embodiment, the macro void 320 is provided below a component 343 of the die 342. In an embodiment, the component 343 may be a laser when the die 342 is a PIC. In other embodiments, the component 343 may be other stress sensitive components, such as a MEMS device. In an embodiment, a trench 321 is formed into the package substrate 330 and surrounds the macro void 320. For example, the trench 321 may be formed in a solder resist layer over laminated organic layers. The trench 321 may act as a physical barrier that prevents the underfill 322 from filling the macro void 320. In the illustrated embodiment, the trench 321 is empty. However, it is to be appreciated that in some embodiments underfill 322 may partially fill the trench 321.

In an embodiment, a vent 325 fluidically couples the macro void 320 to an edge of the underfill 322. As shown, the vent 325 has a height H that is less than the standoff height S between the package substrate 330 and the die 342. For example, the height H may be 20 μm or less, and the standoff height S may be 60 μm or less. The vent 325 exposes a portion of the surface of the package substrate 330. Additionally, a portion of the underfill 322 is provided above the vent 325. That is, underfill 322 is positioned between the die 342 and the vent 325. The ability to form underfill 322 over an unsupported region (i.e., the vent 325) is enable by the use of a sacrificial vent scaffolding, as will be described in greater detail below.

Figure 3C:
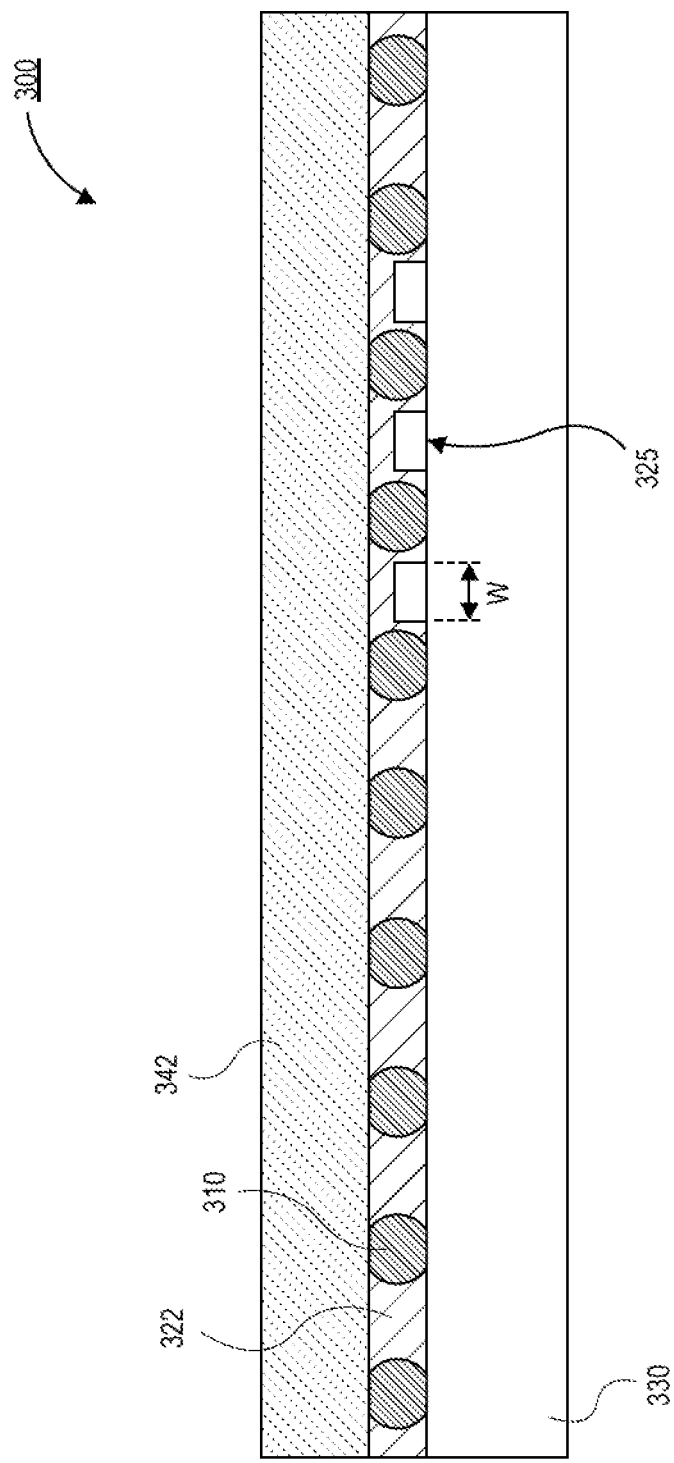
FIG. 3C is a cross-sectional illustration of the electronic package in FIG. 3A along line C-C', in accordance with an embodiment.

Referring now to FIG. 3C, a cross-sectional illustration of the electronic package 300 in FIG. 3A along line C-C' is shown, in accordance with an embodiment. As shown, the vents 325 are provided between the bumps 310. In the illustrated embodiment, the bumps 310 are shown as solder balls. However, it is to be appreciated that the bumps 310 may be any suitable first level interconnect (FLI) architecture, such as copper bumps or the like.

As shown in FIG. 3C, the underfill 322 surrounds a plurality of surfaces of the vents 325. Particularly, the vents 325 may have a bottom surface defined by the package substrate 330, and sidewall and top surfaces defined by the underfill 322. The vents 325 may have a width W that is approximately 20 μm or less. Additionally, while shown as having a substantially rectangular cross-section, it is to be appreciated that the vents 325 may have substantially any shaped cross-section, depending on how a vent scaffolding (described in greater detail below) is formed and patterned. For example, corners of the vents 325 may be rounded in some embodiments.

Figure 4:
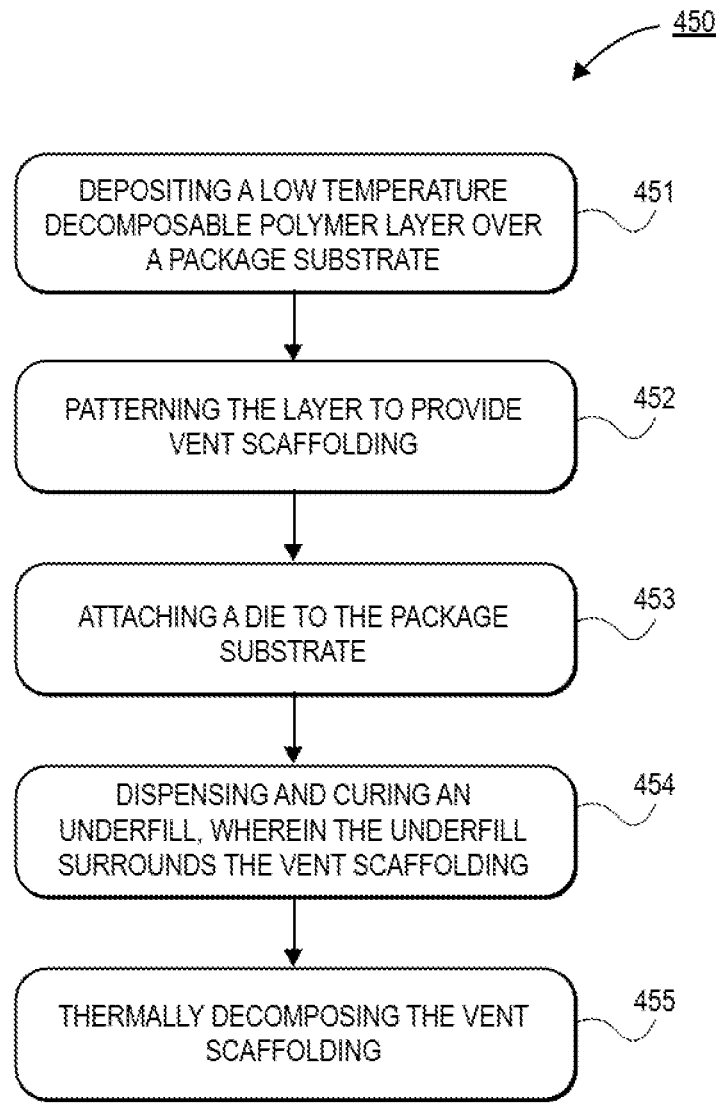
FIG. 4 is a flowchart illustrating a process for forming vents, in accordance with an embodiment.

Referring now to FIG. 4, a flowchart depicting operations in a process 450 for forming vents, such as vents 225 and/or 226, is shown, in accordance with an embodiment. Process 450 is illustrated using cross-sectional illustrations in FIGS. 5A-5E.

Figure 5A:
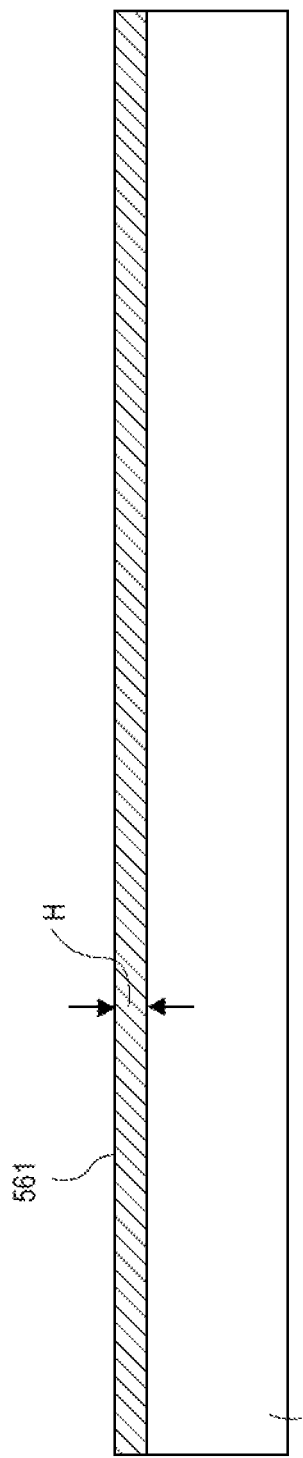
FIG. 5A is a cross-sectional illustration of a package substrate with a low temperature decomposable polymer dispensed over a top surface of the package substrate, in accordance with an embodiment.

In an embodiment, process 450 may begin with operation 451 which comprises depositing a low temperature decomposable polymer layer over a package substrate. As shown in FIG. 5A, the low temperature decomposable polymer layer 561 is disposed over a package substrate 530. In an embodiment, the low temperature decomposable polymer is a material that will decompose at temperatures between approximately 200° C. and 300° C. For example, the decomposable polymer may comprise polyethylene carbonate (PEC) or polypropylene carbonate (PPC). In an embodiment, the polymer layer may be deposited with a spin coating process, though other deposition process are also possible. The thickness H of the polymer layer may be chosen as the ultimate thickness desired for the vents. For example, the thickness H of the polymer layer may be approximately 20 μm or less.

Figure 5B:
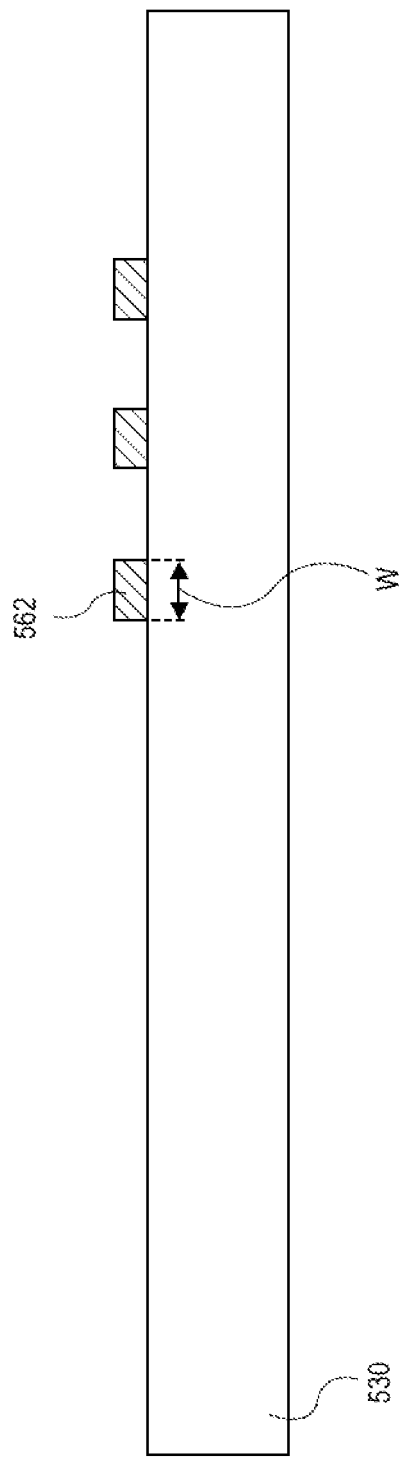
FIG. 5B is a cross-sectional illustration of the package substrate after the low temperature decomposable polymer is patterned to form vent scaffolding, in accordance with an embodiment.

Process 450 may then continue with operation 452 which comprises patterning the polymer layer 561 to provide vent scaffolding 562, as shown in FIG. 5B. In an embodiment, the vent scaffolding 562 may have a width W that is approximately 20 μm or less. In an embodiment, the vent scaffolding 562 comprises a substantially rectangular cross-section. However, it is to be appreciated that the cross-section of the vent scaffolding 562 may be any shape. For example, the patterning process may result in corners of the vent scaffolding 562 being rounded.

In an embodiment, the patterning process may include a photolithography process. In some embodiments, the polymer layer 561 is a photoimageable polymer. In such instances, the polymer layer itself may be exposed and developed. In other embodiments, a patterned mask layer is formed over the polymer layer 561, and the polymer layer 561 is etched. While a photolithography process is shown and described, it is to be appreciated that any deposition process may be used to form the vent scaffolding 562. For example, the vent scaffolding 562 may be directly disposed on the package substrate 530 using a printing process, a screening process, or the like. That is, in some embodiments, a polymer layer 561 may not need to be disposed and patterned.

Figure 5C:
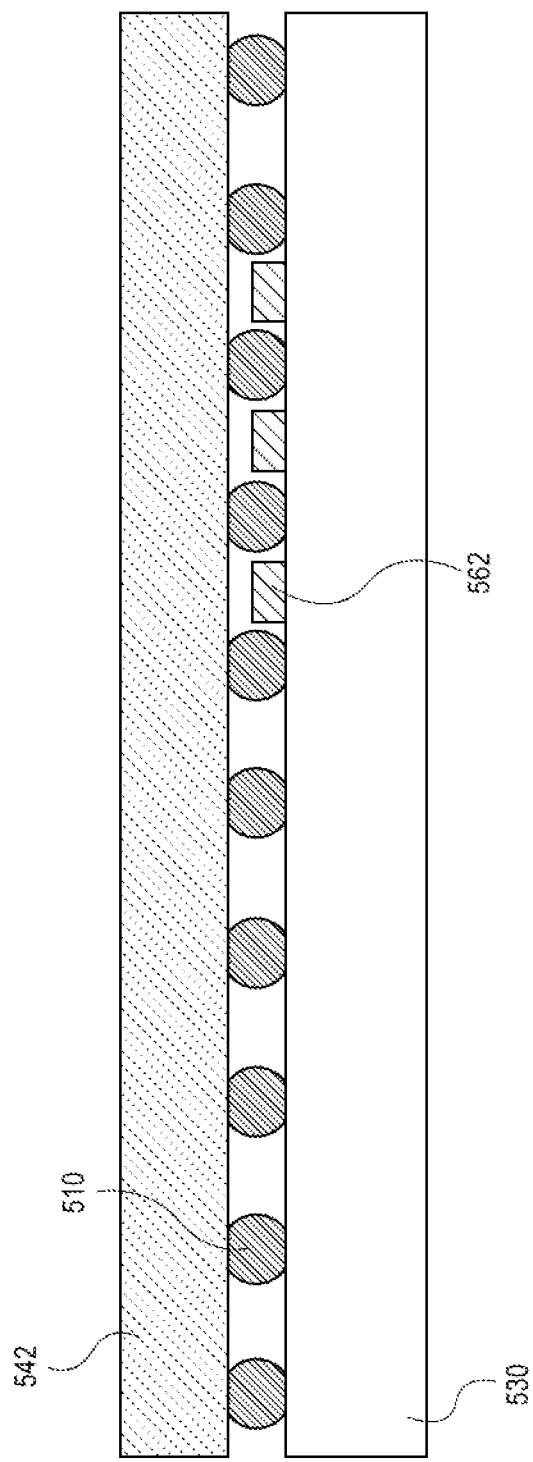
FIG. 5C is a cross-sectional illustration of the package substrate after a die is attached to the package substrate by interconnects, in accordance with an embodiment.

Process 450 may then continue with operation 453 which comprises attaching a die 542 to the package substrate 530, as shown in FIG. 5C. The die 542 is attached to the package substrate 530 over the vent scaffolding 562. That is, the vent scaffolding 562 is provided below the die 542 and a space is provided between a top surface of the vent scaffolding 562 and a bottom surface of the die 542. In an embodiment, the vent scaffolding 562 is provided between interconnects 510. In the illustrated embodiment, the interconnects 510 are shown as solder balls. However, it is to be appreciated that any FLI architecture may be used for the interconnects 510, such as copper bumps and the like.

In a particular embodiment, the die 542 is a PIC. Though, it is to be appreciated that any type of die 542 may be used in accordance with embodiments disclosed herein. In an embodiment, the die 542 attach may be implemented using standard reflow regimes. For example, the die 542 attach may be implemented at approximately 240° C. for 60 seconds. Exposure at this temperature for such a short duration will not significantly decompose the polymer of the vent scaffolding 562.

Figure 5D:
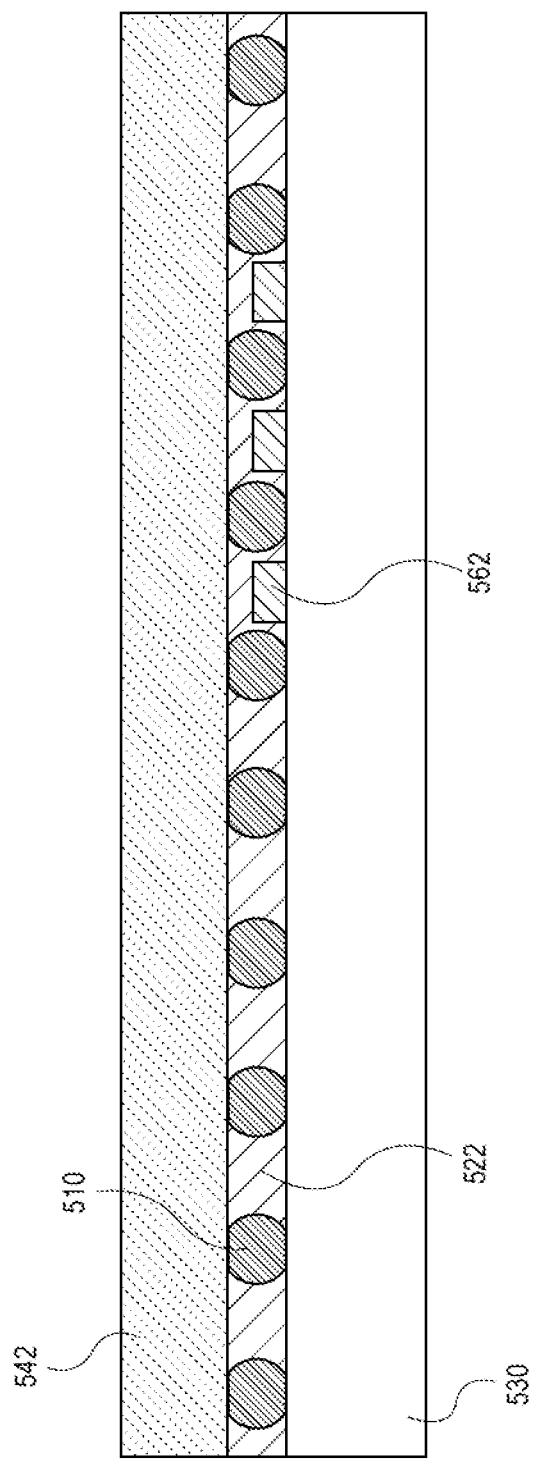
FIG. 5D is a cross-sectional illustration of the package substrate after an underfill is dispensed around the interconnects and the vent scaffolding, in accordance with an embodiment.
Figure 5E:
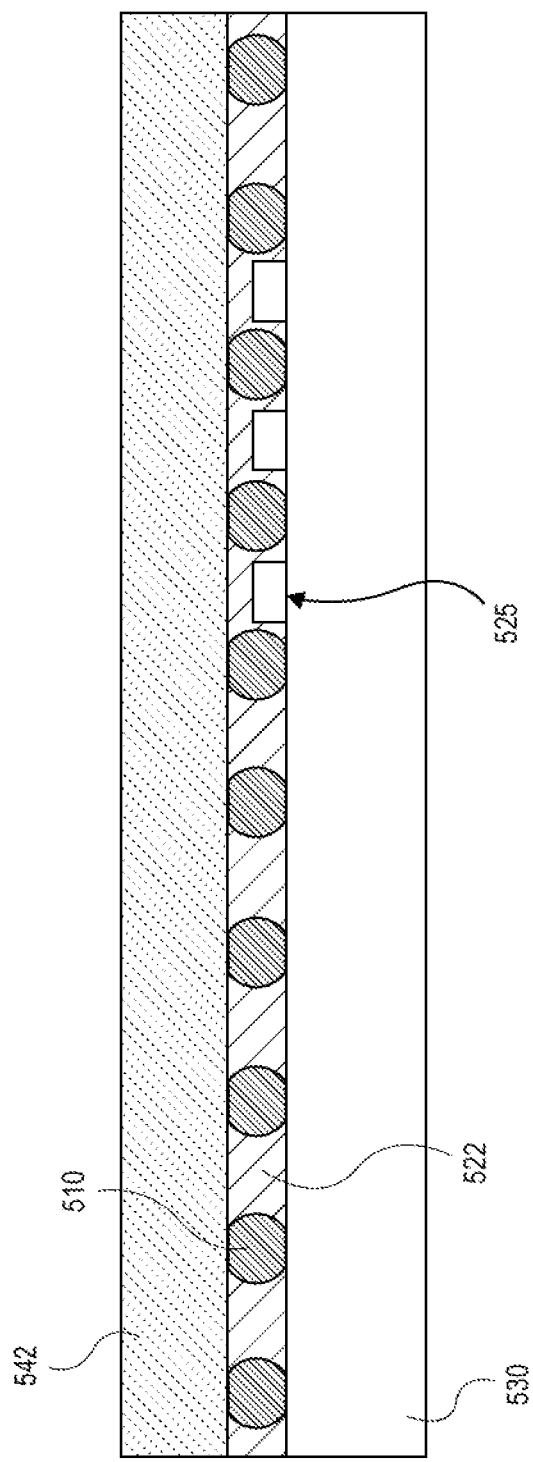
FIG. 5E is a cross-sectional illustration of the package substrate after the vent scaffolding is removed to form vents in the underfill, in accordance with an embodiment.

Process 450 may then continue with operation 454 which comprises dispensing and curing an underfill 522, as shown in FIG. 5D. In an embodiment, the underfill 522 surrounds the vent scaffolding 562. That is, the underfill 522 may cover sidewalls and a top surface of the vent scaffolding 562. The underfill 522 may also be prevented from being dispensed in selected areas below the die 542 to form one or more macro voids (not shown). For example, the macro voids may be defined by a trench into the package substrate that blocks the flow of the underfill 522, similar to the embodiment shown in FIG. 3B. In an embodiment, the vent scaffolding 562 may intersect one or more macro voids.

In an embodiment, the dispensing and curing of the underfill 522 may be implemented at a temperature below 200° C. For example, the dispensing and curing may be implemented at approximately 165° C. for approximately 3 hours. Since the polymer of the vent scaffolding 562 starts degradation between approximately 200° C. and 300° C., the vent scaffolding 562 is not impacted by the curing process.

Process 450 may then continue with operation 455 which comprises thermally decomposing the vent scaffolding 562. In embodiments with a photonics die, the thermal decomposition process may be done at temperatures of approximately 235° C. or lower. This is because at temperatures above 235° C., photonics device lasers are known to be negatively impacted.

In a particular embodiment, the thermal degradation of the vent scaffolding 562 is implemented at a temperature of approximately 200° C. For example, a 200° C. temperature may be achieved using a 0.5° C./minute ramp rate for one hour. In some embodiments, the atmosphere may be oxygen rich in order to speed up the degradation at lower temperatures. In an embodiment, protective caps (e.g., nickel caps) are provided on top of exposed copper (e.g., the interconnects 510) to prevent IMC formation during the thermal degradation of the vent scaffolding 562.

After the thermal degradation, the vent scaffolding is substantially removed, and vents 525 through the underfill 522 are left behind. The vents 525 may expose a top surface of the package substrate 530. Particularly, the vents 525 may be defined by the top surface of the package substrate 530 and portions of the underfill 522. That is, a portion of the underfill 522 may be provided between the vents 525 and a bottom surface of the die 542. In an embodiment, the vents 525 provide an exit for outgassed substances from below the die 542. In a particular embodiment, the vents 525 intersect with macro voids (not shown) in the underfill 522 below the die 542 in order to prevent the formation of a pressure chamber below the die 542. In additional embodiments, the vents 525 may not intersect a macro void. That is, vent 525 formation may be applicable to any flip-chip assembly where outgassing is a concern.

The processes described with respect to FIGS. 5A-5E may be implemented using existing processing capabilities and tools. That is, existing wafer level and assembly process may be used in order to fabricate vents to macro voids. As such, costs and complexity is reduced since no new processing equipment investment is needed.

In FIGS. 2A-5E, venting architectures that are parallel to the package substrate are provided. However, it is to be appreciated that embodiments are not limited to such configurations. For example, vertical venting architectures may also be provided in some embodiments. An example of a vertical venting architecture is provided in FIG. 6.

Figure 6:
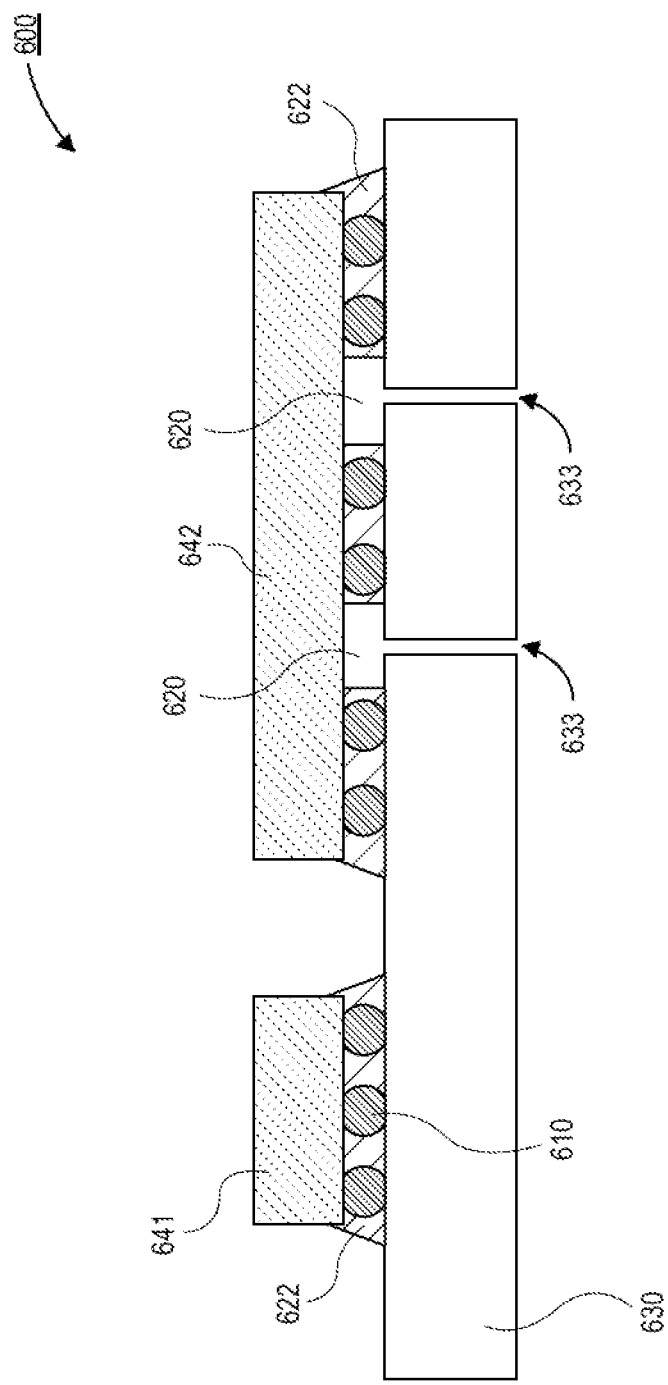
FIG. 6 is a cross-sectional illustration of an electronic package that comprises a PIC with macro voids in the underfill and vents from the macro voids through the package substrate, in accordance with an embodiment.

Referring now to FIG. 6, a cross-sectional illustration of an electronic package 600 is shown, in accordance with an additional embodiment. In an embodiment, the electronic package 600 comprises a package substrate 630. The package substrate 630 may be an organic substrate. A first die 641 and a second die 642 are provided over the package substrate 630. The first die 641 and the second die 642 are connected to the package substrate 630 by bumps 610. In an embodiment, underfill 622 may surround the bumps 610.

In an embodiment, the second die 642 may comprise one or more macro voids 620. The macro voids 620 may be regions below the second die 642 where underfill is absent. Macro voids 620 may be desired in some applications, such as when the second die 642 is a PIC. For example, underfill 622 may not be desired over the regions of the die 642 where lasers are located. Other types of dies 642 may also include stress sensitive components such as dies comprising MEMS devices.

In an embodiment, the macro voids 620 may be vented with vertical vents 633. The vents 633 may pass through a thickness of the package substrate 630. That is, the macro voids 620 are vented to the backside of the package substrate 630 instead of to the edge of the underfill 622. In an embodiment, the vents 633 may have a diameter that is approximately 100 μm or less. Sub-100 μm drill diameter holes can be made into the package substrate 630 without damaging the integrity of the package substrate 630. In the illustrated embodiment, a single vent 633 is provided to each of the macro voids 620. However, it is to be appreciated that embodiments may include a plurality of vertical vents 633 that intersect with an individual macro void 620. In an embodiment, the vents 633 may be drilled before the die 642 is attached or after the die 642 is attached.

Figure 7:
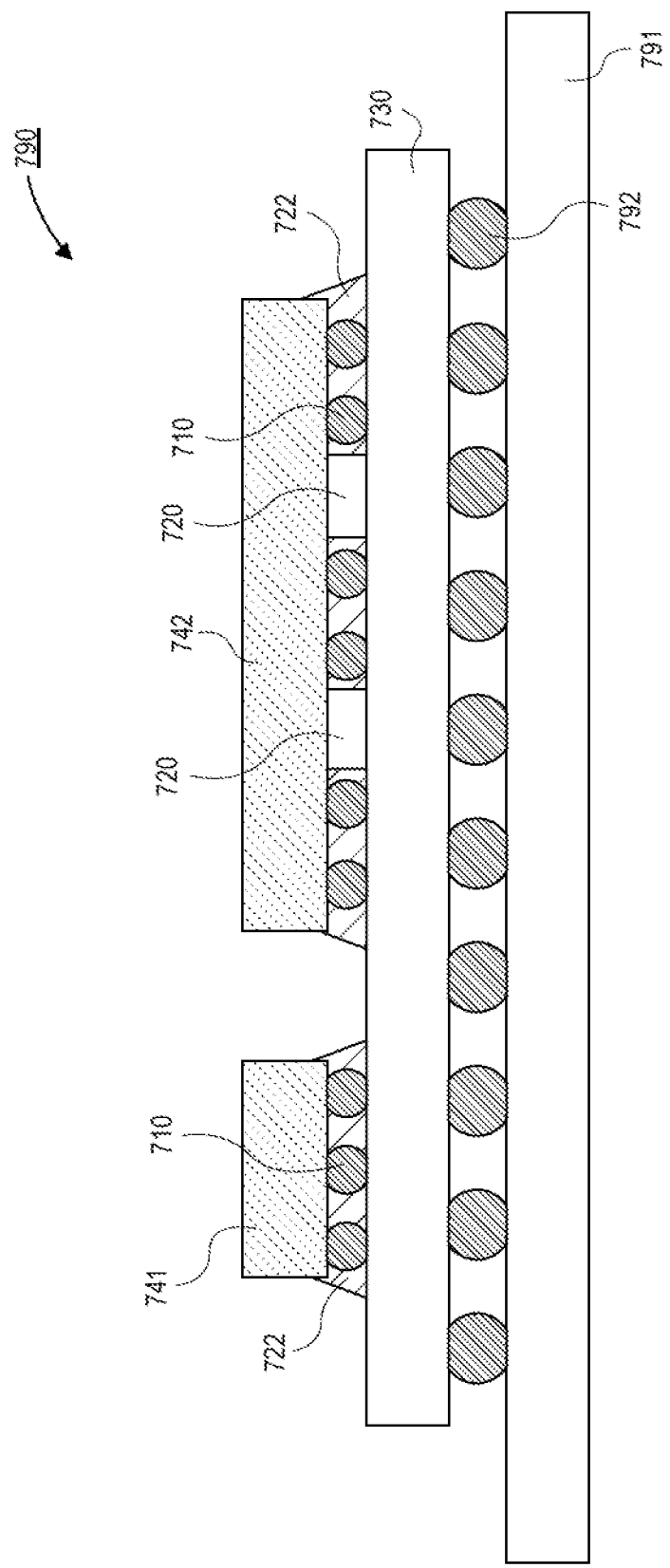
FIG. 7 is a cross-sectional illustration of an electronic system that comprises a PIC with macro voids and vents in the underfill, in accordance with an embodiment.

Referring now to FIG. 7, a cross-sectional illustration of an electronic system 790 is shown, in accordance with an embodiment. In an embodiment, electronic system 790 may comprise a board 791 (e.g., a printed circuit board (PCB)). A package substrate 730 is attached to the board 791. In an embodiment, the board 791 is attached to the package substrate 730 by interconnects 792. The interconnects 792 are shown as solder balls, but it is to be appreciated that the interconnects 792 may be sockets, or any other interconnect architecture.

In an embodiment, a first die 741 and a second die 742 are attached to the package substrate 730 by solder balls 710. The solder balls 710 may be surrounded by an underfill 722. In an embodiment, one or more macro voids 720 may be provided below the second die 742. For example, the second die 742 may be a PIC, and the macro voids 720 may be located below lasers of the PIC. In other embodiments, the macro voids 720 may be provided below MEMS devices or other stress sensitive components.

In an embodiment, one or more vents (not shown) may intersect with each of the macro voids 720. For example, vents that are parallel to the package substrate 730 (e.g., similar to vents 225 in FIGS. 2A and 2B) may be provided through the underfill 722. In other embodiments, vertical vents through the package substrate 730 (e.g., similar to vents 633 in FIG. 6) may be provided. In other embodiments, a parallel vent and a vertical vent may both be provided to one or more of the macro voids 720.

Accordingly, the macro voids 720 are able to have pressure released that would otherwise build up from moisture degassing from substrates and solvent degassing during epoxy cure. Since the pressure can be released from the macro voids 720, damage to the neighboring joints, silicon, or substrate during subsequent thermal exposure steps like surface mount during module assembly is avoided. Therefore, electronic package architectures that include macro voids are enabled without having the reliability concerns described above.

Figure 8:
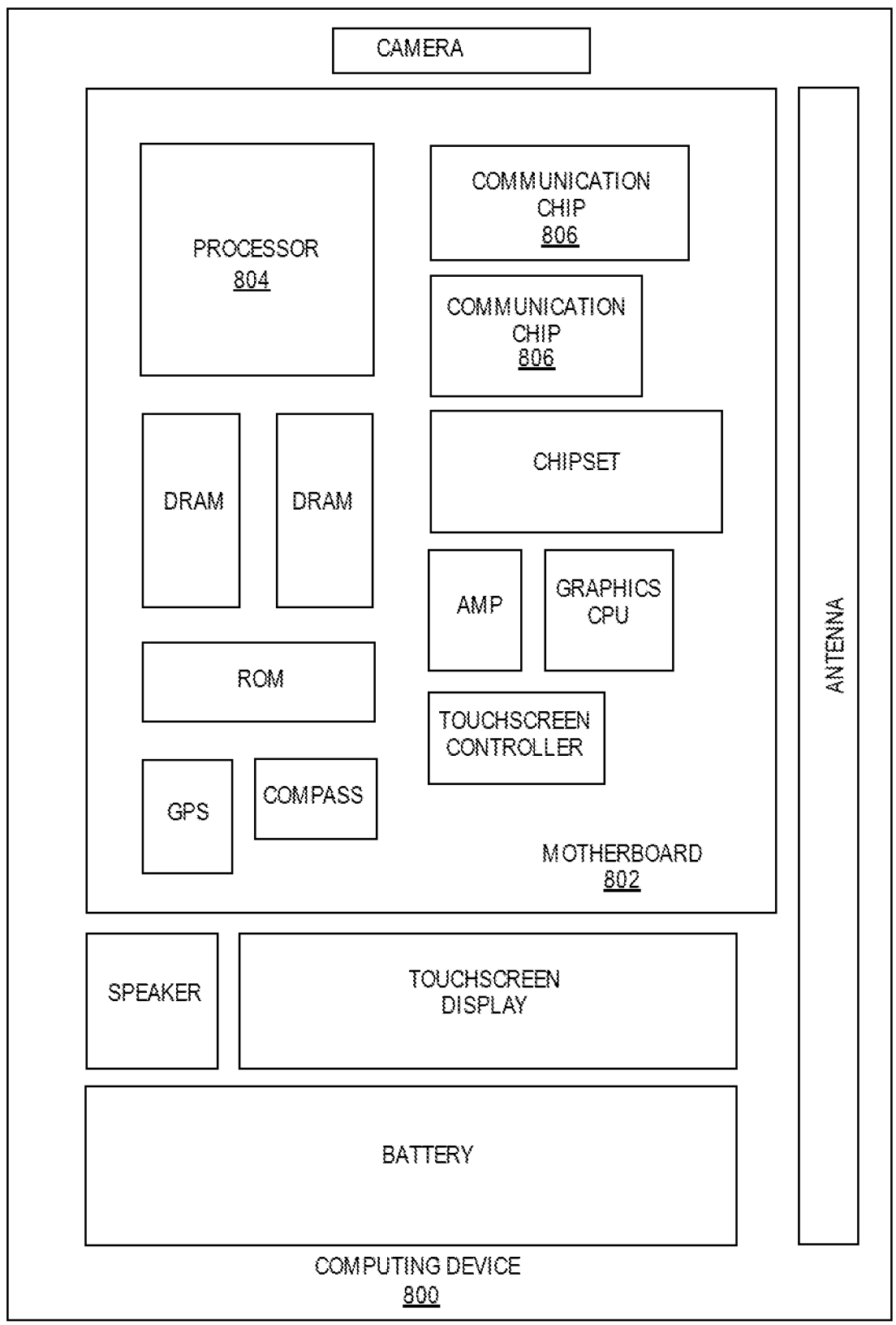
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be part of an electronic package that comprises a macro void in an underfill with one or more vents coupled to the macro void, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be part of an electronic package that comprises a macro void in an underfill with one or more vents coupled to the macro void, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a die attached to the package substrate by interconnects; an underfill under the die and surrounding the interconnects, wherein a void is provided in the underfill; and a vent, wherein the vent is fluidically coupled to the void and extends to an edge of the underfill.

Example 2: the electronic package of Example 1, wherein the die is a photonics integrated circuit (PIC).

Example 3: the electronic package of Example 2, wherein a laser on the die is positioned over the void.

Example 4: the electronic package of Examples 1-3, wherein the vent exposes a surface of the package substrate.

Example 5: the electronic package of Examples 1-4, wherein the underfill is between the vent and the die.

Example 6: the electronic package of Examples 1-5, wherein the vent has a height that is less than a standoff distance between the package substrate and the die.

Example 7: the electronic package of Example 6, wherein the height of the vent is approximately 20 µm or less.

Example 8: the electronic package of Examples 1-7, wherein a width of the vent is approximately 20 µm or less.

Example 9: the electronic package of Examples 1-8, further comprising: a second vent, wherein the second vent intersects the void and extends to the edge of the underfill.

Example 10: the electronic package of Examples 1-9, wherein the void is surrounded by a trench in the package substrate.

Example 11: the electronic package of Examples 1-10, further comprising: a second void in the underfill; and a second vent, wherein the second vent intersects the second void and extends to the edge of the underfill.

Example 12: an electronic package, comprising: a package substrate; a die attached to the package substrate by a plurality of interconnects; an underfill surrounding the plurality of interconnects; and a vent in the underfill, wherein the vent extends to an edge of the underfill.

Example 13: the electronic package of Example 12, wherein the plurality of interconnects are flip-chip interconnects.

Example 14: the electronic package of Example 12 or Example 13, wherein the vent has a height that is less than a standoff distance between the package substrate and the die.

Example 15: the electronic package of Example 14, wherein the height is approximately 20 µm or less.

Example 16: the electronic package of Examples 12-15, wherein a width of the vent is approximately 20 µm or less.

Example 17: the electronic package of Examples 12-16, further comprising: a void in the underfill within a perimeter of the die, wherein the void is intersected by the vent.

Example 18: the electronic package of Examples 12-17, wherein the die comprises a microelectromechanical system (MEMS) device.

Example 19: the electronic package of Examples 12-18, wherein the underfill is between the vent and the die.

Example 20: a method of forming an electronic package, comprising: depositing a low temperature decomposable polymer layer over a package substrate; patterning the low temperature decomposable polymer layer to provide vent scaffolding; attaching a die to the package substrate; dispensing and curing an underfill, wherein the underfill surrounds the vent scaffolding; and thermally decomposing the vent scaffolding.

Example 21: the method of Example 20, wherein the low temperature decomposable polymer layer comprises polyethylene carbonate (PEC) or polypropylene carbonate (PPC).

Example 22: the method of Example 20 or Example 21, wherein the low temperature decomposable polymer layer is deposited with a spin coating process.

Example 23: the method of Examples 20-22, wherein the low temperature decomposable polymer layer is a photosensitive material that can be exposed and patterned.

Example 24: an electronic system, comprising: a board; a package substrate attached to the board; a die attached to the package substrate by interconnects; an underfill under the die and surrounding the interconnects, wherein a void is provided in the underfill; and a vent, wherein the vent is fluidically coupled to the void and extends to an edge of the underfill.

Example 25: the electronic system of Example 24, wherein the vent has a thickness that is less than a standoff height between the package substrate and the die.

What is claimed is:

1. An electronic package, comprising:
   a package substrate;
   a die attached to the package substrate by interconnects, the interconnect comprising bumps having a pitch;
   an underfill under the die and surrounding the interconnects, wherein a void is in the underfill;
   a first vent along a first direction, wherein the first vent is fluidically coupled to the void and extends to an edge of the underfill, wherein the first vent is between a first bump and a second bump of the bumps having the pitch, and wherein a third bump of the bumps is spaced apart from the second bump by the pitch; and
   a second vent, wherein the second vent intersects the void and extends to the edge of the underfill, the second vent along a second direction orthogonal to the first direction.

2. The electronic package of claim 1, wherein the die is a photonics integrated circuit (PIC).

3. The electronic package of claim 2, wherein a laser on the die is positioned over the void.

4. The electronic package of claim 1, wherein the first vent exposes a surface of the package substrate.

5. The electronic package of claim 1, wherein the underfill is between the first vent and the die.

6. The electronic package of claim 1, wherein the first vent has a height that is less than a standoff distance between the package substrate and the die.

7. The electronic package of claim 6, wherein the height of the first vent is approximately 20 µm or less.

8. The electronic package of claim 1, wherein a width of the first vent is approximately 20 µm or less.

9. The electronic package of claim 1, wherein the void is surrounded by a trench in the package substrate.

10. The electronic package of claim 1, further comprising:
    a second void in the underfill; and
    a third vent, wherein the third vent intersects the second void and extends to the edge of the underfill.

11. An electronic package, comprising:
    a package substrate;
    a die attached to the package substrate by a plurality of interconnects, the interconnect comprising bumps having a pitch;
    an underfill surrounding the plurality of interconnects;
    a first vent in the underfill, the first vent along a first direction, wherein the first vent extends to an edge of the underfill, wherein the first vent is between a first bump and a second bump of the bumps having the pitch, and wherein a third bump of the bumps is spaced apart from the second bump by the pitch; and
    a second vent, wherein the second vent extends to the edge of the underfill, the second vent along a second direction orthogonal to the first direction.

12. The electronic package of claim 11, wherein the plurality of interconnects are flip-chip interconnects.

13. The electronic package of claim 12, wherein the first vent has a height that is less than a standoff distance between the package substrate and the die.

14. The electronic package of claim 13, wherein the height is approximately 20 µm or less.

15. The electronic package of claim 11, wherein a width of the first vent is approximately 20 µm or less.

16. The electronic package of claim 11, further comprising:
    a void in the underfill within a perimeter of the die, wherein the void is intersected by the first vent.

17. The electronic package of claim 11, wherein the die comprises a microelectromechanical system (MEMS) device.

18. The electronic package of claim 11, wherein the underfill is between the first vent and the die.

19. An electronic system, comprising:
    a board;
    a package substrate attached to the board;
    a die attached to the package substrate by interconnects, the interconnect comprising bumps having a pitch;
    an underfill under the die and surrounding the interconnects, wherein a void is in the underfill;
    a first vent along a first direction, wherein the first vent is fluidically coupled to the void and extends to an edge of the underfill, wherein the first vent is between a first bump and a second bump of the bumps having the pitch, and wherein a third bump of the bumps is spaced apart from the second bump by the pitch; and
    a second vent, wherein the second vent intersects the void and extends to the edge of the underfill, the second vent along a second direction orthogonal to the first direction.

20. The electronic system of claim 19, wherein the first vent has a thickness that is less than a standoff height between the package substrate and the die.

* * * * *